US012598099B2

(12) United States Patent
Delshadpour et al.

(10) Patent No.: US 12,598,099 B2
(45) Date of Patent: Apr. 7, 2026

(54) PROGRAMMABLE EQUALIZER

(71) Applicant: NXP USA, Inc., Austin, TX (US)

(72) Inventors: Siamak Delshadpour, Phoenix, AZ (US); David Edward Bien, Glendale, AZ (US)

(73) Assignee: NXP USA, Inc., Austin, TX (US)

( * ) Notice: Subject to any disclaimer, the term of this patent is extended or adjusted under 35 U.S.C. 154(b) by 250 days.

(21) Appl. No.: 18/467,932

(22) Filed: Sep. 15, 2023

(65) Prior Publication Data

US 2025/0097083 A1     Mar. 20, 2025

(51) Int. Cl.
| | |
|---|---|
| *H04L 27/01* | (2006.01) |
| *H04B 3/04* | (2006.01) |
| *H04L 25/03* | (2006.01) |
| *H03K 17/687* | (2006.01) |

(52) U.S. Cl.
CPC .. *H04L 25/03885* (2013.01); *H04L 25/03847* (2013.01); *H03K 17/687* (2013.01)

(58) Field of Classification Search
CPC ......... H04L 27/01; H04L 7/00; H04L 7/0058; H04L 25/02; H04L 25/497; H04L 25/03847; H04L 25/03885; H04L 25/03433; H04B 3/04; H04B 3/144
USPC .......................................................... 333/18
See application file for complete search history.

(56) References Cited

U.S. PATENT DOCUMENTS

| | | | |
|---|---|---|---|
| 7,737,759 | B2 | 6/2010 | Gaeta et al. |
| 8,213,638 | B2 | 7/2012 | Fan et al. |
| 9,225,560 | B1 | 12/2015 | Mishra et al. |
| 9,860,086 | B1 | 1/2018 | Shiraishi et al. |
| 10,164,809 | B2 | 12/2018 | Ulrich et al. |
| 10,447,507 | B1 | 10/2019 | Zhang et al. |
| 10,841,134 | B1 | 11/2020 | Wachi et al. |

(Continued)

OTHER PUBLICATIONS

U.S. Appl. No. 18/467,970; Non-Final Office Action mailed Jun. 23, 2025; 23 pages.

(Continued)

*Primary Examiner* — Hai L Nguyen

(57)     ABSTRACT

One example discloses An equalizer, including: a first transistor and a second transistor both coupled to a first differential input (IP); a third transistor and a fourth transistor both coupled to a second differential input (IN); a first impedance ($Z_{E1}$) coupled between the second transistor and the third transistor; a second impedance ($Z_{E2}$) coupled between the first transistor and the fourth transistor; a first load resistance ($R_{L1}$) coupled to a first supply node; a second load resistance ($R_{L2}$) coupled to the first supply node; a current steering circuit coupled between the first, second, third and fourth transistors and the first and second load resistances; and a controller; wherein the controller is configured to adjust the current steering circuit to route a first percentage of an amplification current through the first impedance ($Z_{E1}$) and a second percentage of the amplification current through the second impedance ($Z_{E2}$).

21 Claims, 5 Drawing Sheets

(56)                 References Cited

U.S. PATENT DOCUMENTS

| | | |
|---|---|---|
| 10,924,307 B1 | 2/2021 | Zhang et al. |
| 10,992,501 B1 | 4/2021 | Sun et al. |
| 11,128,497 B1 | 9/2021 | Sun et al. |
| 11,206,160 B2 | 12/2021 | Delshadpour et al. |
| 11,296,667 B1 * | 4/2022 | Delshadpour ......... H03F 1/3211 |
| 11,296,737 B1 | 4/2022 | Delshadpour |
| 11,356,302 B1 | 6/2022 | Sun et al. |
| 12,068,893 B2 * | 8/2024 | Geng ........................ H03F 1/22 |
| 2004/0190661 A1 | 9/2004 | Vrazel |
| 2021/0359884 A1 | 11/2021 | Delshadpour et al. |

OTHER PUBLICATIONS

U.S. Appl. No. 18/467,970; Final Office Action mailed Apr. 9, 2025; 19 pages.

U.S. Appl. No. 18/467,970; filed Sep. 15, 2023; 38 pages.

U.S. Appl. No. 18/467,970; Non-Final Office Action mailed Dec. 27, 2024; 15 pages.

Delshadpour, Siamak et al.; "A 20.6 GB/s Programmable Peaking Gain CTLE"; 2020 IEEE 63rd International Midwest Symposium on Circuits and Systems; Aug. 2020; pp. 762-765.

Delshadpour, Siamak et al.; "A 5.4 Gbps Protocol Based CMOS Limiting ReDriver for Type-C Applications"; 2019 IEEE 62nd International Midwest Symposium on Circuits and Systems; Aug. 2019; pp. 255-258.

Liu, Tong et al.; "A 40Gb/s Linear Redriver with Multi-Band Equalization in 130nm SiGe BiCMOS"; 2021 IEEE BiCMOS and Compound Semiconductor Integrated Circuits and Technology Symposium; Dec. 2021; 4 pages.

US Application # U.S. Appl. No. 18/467,970; Notice of Allowance mailed Nov. 10, 2025; 10 pages.

* cited by examiner

PROGRAMMABLE EQUALIZER

The present specification relates to systems, methods, apparatuses, devices, articles of manufacture and instructions for programmable equalizers.

SUMMARY

According to an example embodiment, an equalizer, comprising: a first transistor and a second transistor both coupled to a first differential input (IP); a third transistor and a fourth transistor both coupled to a second differential input (IN); a first impedance ($Z_{E1}$) coupled between the second transistor and the third transistor; a second impedance ($Z_{E2}$) coupled between the first transistor and the fourth transistor; a first load resistance ($R_{L1}$) coupled to a first supply node; a second load resistance ($R_{L2}$) coupled to the first supply node; a current steering circuit coupled between the first, second, third and fourth transistors and the first and second load resistances; a first bias current source coupled to the first transistor, the second impedance and a second supply node; a second bias current source coupled to the second transistor, the first impedance and the second supply node; a third bias current source coupled to the third transistor, the first impedance and the second supply node; a fourth bias current source coupled to the fourth transistor, the second impedance and the second supply node; and a controller; wherein the controller is configured to adjust the current steering circuit to route a first percentage of an amplification current through the first impedance ($Z_{E1}$) and a second percentage of the amplification current through the second impedance ($Z_{E2}$).

In another example embodiment, the controller is configured to generate a first control signal ($V_{B+}$) and a second control signal ($V_{B-}$); and the current steering circuit includes a set of transistors (Qc1-Qc6) responsive to the first and second control signals ($V_{B+}$, $V_{B-}$).

In another example embodiment, the equalizer is configured to have a greater gain by setting the first control signal ($V_{B+}$) to a value greater than the second control signal ($V_{B-}$).

In another example embodiment, the equalizer is configured to have a minimum gain by setting the first control signal ($V_{B+}$) to a value equal to the second control signal ($V_{B-}$).

In another example embodiment, the controller is configured to keep the first, second, third and fourth bias currents constant while the controller varies the first and second control signal ($V_{B+}$, $V_{B-}$) sent to the set of transistors (Qc1-Qc6).

In another example embodiment, the current steering circuit includes a set of transistors (Qc1-Qc6) that are responsive to a first control signal ($V_{B+}$) and a second control signal ($V_{B-}$) received from the controller; the first transistor (Qc1) includes a collector coupled to the first load resistance ($R_{L1}$), an emitter coupled to a collector of the first transistor (Qi1), and a base coupled to receive the first control signal ($V_{B+}$); the second transistor (Qc2) includes a collector coupled to the first load resistance ($R_{L1}$), an emitter coupled to a collector of the second transistor (Qi2), and a base coupled to receive the first control signal ($V_{B+}$); the third transistor (Qc3) includes a collector coupled to the second load resistance ($R_{L2}$), an emitter coupled to the collector of the second transistor (Qi2), and a base coupled to receive the second control signal ($V_{B-}$); the fourth transistor (Qc4) includes a collector coupled to the first load resistance ($R_{L1}$), an emitter coupled to a collector of the third transistor (Qi3), and a base coupled to receive the second control signal ($V_{B-}$); the fifth transistor (Qc5) includes a collector coupled to the second load resistance ($R_{L2}$), an emitter coupled to the collector of the third transistor (Qi3), and a base coupled to receive the first control signal ($V_{B+}$); and the sixth transistor (Qc6) includes a collector coupled to the second load resistance ($R_{L2}$), an emitter coupled to a collector of the fourth transistor (Qi4), and a base coupled to receive the first control signal ($V_{B+}$).

In another example embodiment, the first transistor is a first bipolar transistor (Qi1), the second transistor is a second bipolar transistor (Qi2), the third transistor is a third bipolar transistor (Qi3), and the fourth transistor is a fourth bipolar transistor (Qi4); a base of the first transistor (Qi1) and a base of the second transistor (Qi2) are both coupled to the first differential input (IP); a base of the third transistor (Qi3) and a base of the fourth transistor (Qi4) are both coupled to the second differential input (IN); the first impedance is coupled between an emitter of the second transistor and an emitter of the third transistor; the second impedance is coupled between an emitter of the first transistor and an emitter of the fourth transistor; a collector of the first transistor (Qi1) is coupled to the first transistor (Qc1); a collector of the second transistor (Qi2) is coupled to the second transistor (Qc2) and the third transistor (Qc3); a collector of the third transistor (Qi3) is coupled to the fourth transistor (Qc4) and the fifth transistor (Qc5); and a collector of the fourth transistor (Qi4) is coupled to the sixth transistor (Qc6).

In another example embodiment, the first transistor is a first MOS device, the second transistor is a second MOS device, the third transistor is a third MOS device, and the fourth transistor is a fourth MOS device; a gate of the first MOS device and a gate of the second MOS device are both coupled to the first differential input (IP); a gate of the third MOS device and a gate of the fourth MOS device are both coupled to the second differential input (IN); the first impedance is coupled between a source of the second MOS device and an source of the third MOS device; the second impedance is coupled between a source of the first MOS device and an source of the fourth MOS device; a drain of the first MOS device is coupled to the first transistor (Qc1); a drain of the second MOS device is coupled to the second transistor (Qc2) and the third transistor (Qc3); a drain of the third MOS device is coupled to the fourth transistor (Qc4) and the fifth transistor (Qc5); and a drain of the fourth MOS device is coupled to the sixth transistor (Qc6).

In another example embodiment, wherein the controller includes, a first transistor having a first terminal coupled to the first supply node, a second terminal coupled to the second supply node through a first current source (0.5*IE), and a third terminal coupled to a reference voltage (Vref); a second transistor having a first terminal coupled to the first supply node, a second terminal coupled to the second supply node through a second current source ($0.5*I_E$), and a third terminal coupled to the reference voltage (Vref); wherein the first control signal ($V_{B+}$) is tapped from between the first transistor and the first current source ($0.5*I_E$); and wherein the second control signal ($V_{B-}$) is tapped from between the second transistor and the second current source ($0.5*I_E$).

In another example embodiment, the controller is further configured to adjust the first, second, third and fourth current sources to route the first percentage of an amplification current through the first impedance ($Z_{E1}$) and the second percentage of the amplification current through the second impedance ($Z_{E2}$).

In another example embodiment, a first output (OP) is coupled between the first load resistance ($R_{L1}$) and the current steering circuit; and a second output (ON) is coupled between the second load resistance ($R_{L2}$) and the current steering circuit.

In another example embodiment, the first supply node is a power supply node; and the second supply node is a ground reference node.

In another example embodiment, the first load resistance ($R_{L1}$) and the second load resistance ($R_{L2}$) are bulk resistors and not parasitic resistances.

In another example embodiment, the first, second, third and fourth transistors only receive power from the first supply node through either or both the first load resistance ($R_{L1}$) and the second load resistance ($R_{L2}$).

In another example embodiment, the controller is configured to further steer the amplification current between the first impedance and the second impedance by adjusting weight assigned to the first, second, third and fourth current sources.

In another example embodiment, the first impedance ($Z_{E1}$) is a low-frequency (DC) path for the amplification current; and the second impedance ($Z_{E2}$) is a high-frequency (AC) path for the amplification current.

In another example embodiment, the first and second impedances are independently adjustable.

In another example embodiment, the equalizer is a continuous time linear equalizer (CTLE).

In another example embodiment, the controller is configured to adjust a bias current for both the second and third bias current sources coupled to either end of the first impedance ($Z_{E1}$) by varying a first control signal sent to each of the second and third bias current sources; and the controller is configured to adjust a bias current for both the first and fourth bias current sources coupled to either end of the second impedance ($Z_{E2}$) by varying a second control signal sent to each of the first and fourth bias current sources.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
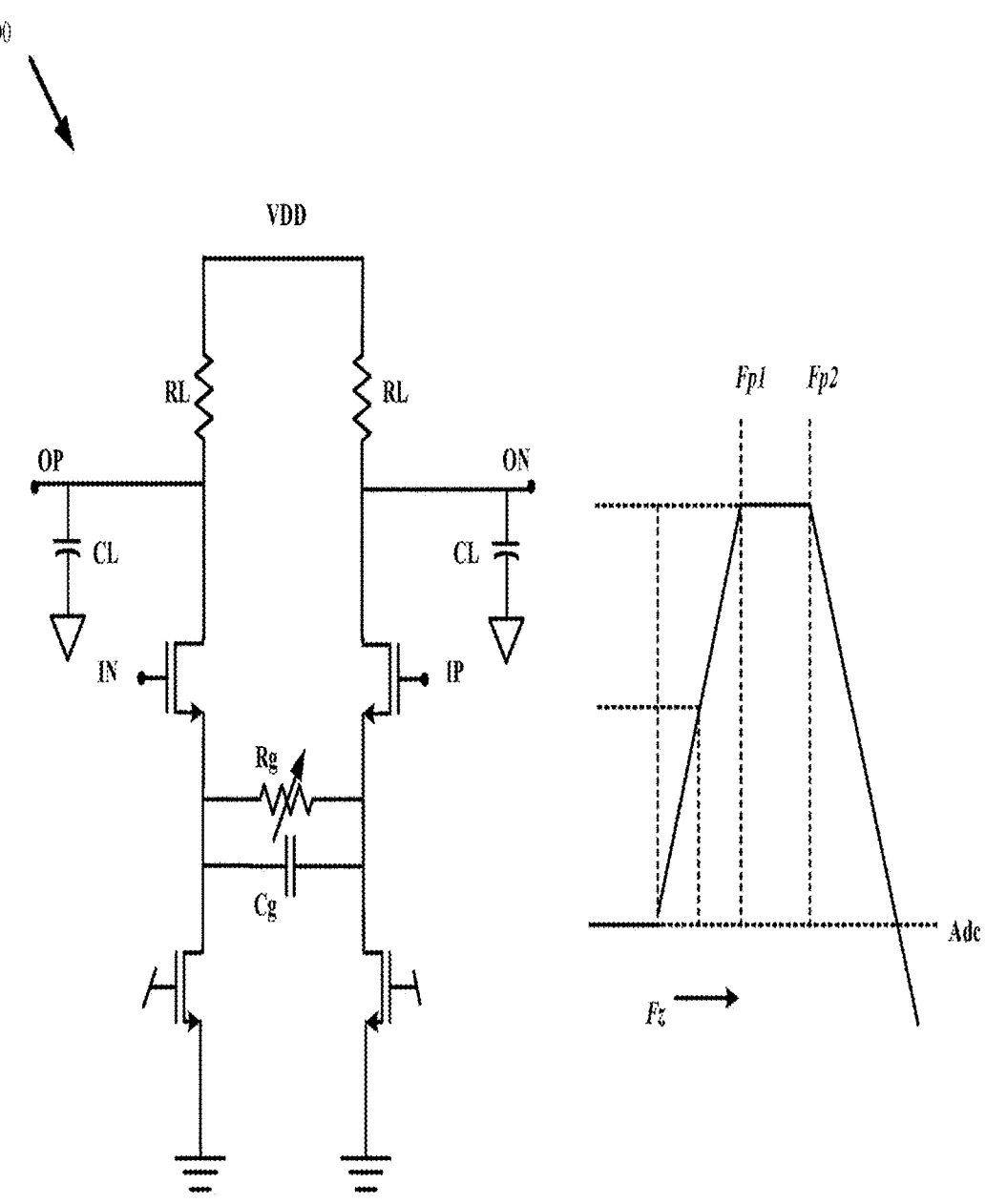
FIG. 1 represents a first example equalizer circuit and its AC gain response.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Equalizers, such as continuous-time linear equalizers (CTLEs), are in some applications employed at a receiver's (RX) front end to compensate for channel loss and provide equalized low-jitter output data. For example, CTLE circuits are used in data communications circuits to shape the pulse response in a way that helps overcome channel losses and impairments for improved data recovery. Longer cable or PCB traces means more insertion loss at certain frequency. A main job of an equalizer is compensation of such loss, so higher loss compensation/higher order pole/zero means compensation of higher loss.

CTLE commonly achieve this by varying their high frequency gain relative to their low frequency gain in order to obtain a desirable response. CTLEs are often implemented as two gain stages in parallel with different frequency characteristics but driving a common load with the gain of one or more stages variable. CTLEs ensure precursor as well as postcursor equalization as compared to other nonlinear equalizers like the decision-feedback equalizers (DFE), which realize only postcursor equalization.

Low power consumption is desirable, and it is an inherent desired feature that the CTLE maintains some minimum linear signal level at a low level of supply current.

FIG. 1 represents a first example 100 of a conventional equalizer circuit. One of the goals of an equalizer is to realize a transfer function which by selecting component values can be tuned such that it is inverse of the channel transfer function. If properly tuned, the equalizer improves the receiver performance parameters, such as BER and jitter tolerance.

Capacitive source-degenerated first order continuous time linear equalizer (CTLE) with one zero and two poles, provide some capability to control a shape of CTLE transfer function. For example, DC gain and transfer function, where $g_m/2$ is a transconductance of differential pair transistors, can be written as:

$$A_{dc} = R_L/(R_g + 1/g_m), \text{ and} \qquad \text{[equation 1]}$$

$$H(s) \approx A_{ac}(1 + sR_gC_g)/((1 + 2sC_g/g_m)(1 + sR_LC_L)). \qquad \text{[equation 2]}$$

As it is seen from equation (1), $R_g$ adjustment will change DC gain ($A_{dc}$) and zero location. It is difficult to get high peaking gain and equal gain steps from this conventional topology. A maximum (i.e. peaking) gain is:

$$A_{pk} = g_m * R_L. \qquad \text{[equation 3]}$$

Although a CMOS based circuit is shown here, BJT based circuits follow similar rules.

Tuning a CTLE's peaking gain is accomplished by changing a source degeneration resistor (Rg) for a MOS device shown here (or similarly for an emitter degeneration resistor for a bi-polar junction transistor). In this way, the DC attenuation will be changed while the peaking gain is fixed, where peaking gain=$g_m*R_L$.

A problem however is when only the degeneration resistor ($R_g$) is changed, then the peaking frequency will also change because a zero created by degeneration RC pair (i.e. $\omega_{zero}=1/R_g C_g$) while the capacitor is fixed. To keep the peak frequency fixed, we need to tune/adjust both $R_g$ and $C_g$ to change the peaking gain while maintaining a same peaking frequency.

In high-speed applications, due to nature of loss and incoming wide-band signals, some programmability in DC gain and/or peaking gain is needed to provide the best equalization. Such programming often includes switchable components which add parasitic effects that can't be easily handled by the CTLE. These parasitic resistance and capacitance can't be well controlled and will cause unexpected peaking at low frequency or reduce the expected tuning range because the parasitic resistor and capacitor need to be calculated into the total amount of caps and resistors we can have for the tuning part, so the actual tuning range will be reduced by the parasitic.

Due to these parasitic components, if using discrete tuning steps, then there would need to be different resistor and capacitor settings for each step. If using a varactor as the tuning capacitor, the varactor will introduce less parasitic effects to the CTLE, but tuning will not be predictable because an exact value of the varactor would be unknown. Adding another tuning/trimming for varactor is expensive and adds more parasitic components.

In CTLE's four differential transistor pairs are often used as gain stages and their bias current is varied to control the equalizer's gain. Equalizers with such bias-controlled (BC) gain stages have an inherent disadvantage because for example reducing the bias current also reduces the equalizer's linear range along with its gain. Additionally, reducing the bias current is likely to negatively impact transistor linearity and frequency response causing further equalizer performance impairments.

For example, at ¼ the gain the linear output voltage range is only ¼ of the output range at the full bias level. The other parallel stage is often configured with significant degeneration and though it may have a large linear output range it can only contribute a lower gain, so the combined gain characteristic of the CTLE arrangement is limited to ¼ of the full range at ¼ of the gain. Linearity suffers further as bias is reduced because transistor elements such as internal Ohmic resistance or other degenerative elements are de-biased and reduce the linear input range.

Even less desirable, cascading two of such CTLEs would result in peaking gain over PVT variations that are twice that of a single stage CTLE.

Some equalizers, e.g. two dimensional equalizers, also connect their transistors directly to their power supply (e.g. Vdd, Vcc, etc.) creating a number of additional power source loads (e.g. "dummy loads") to keep a total transconductance ($g_m$) of their cores (i.e. $g_{m1}+g_{m2}$) constant. Note, any transistor directly connected to a power supply is herein defined as a "dummy load". Such dummy current paths divert signal amplification currents away from their load impedances and do not contribute to the equalizer's output signal amplification or the linear output range of the equalizer.

Now discussed are example embodiments of equalizer circuit topologies that enable more predictable programmability and without such parasitic currents. In some example embodiments, these equalizer circuit topologies consume about 50% less current compared to other equalizers.

These "two dimensional" equalizer topologies provide similar performance (AC peaking gain and DC gain) with less generated input noise due to up to half of the needed core amplification transistors (e.g. lower noise is important for PAM4 applications). "Two dimensional" is herein defined as an equalizer that uses a combination of DC and AC gains to shape an overall equalizer gain curve.

These topologies are good for very high-frequency applications which need high AC peaking gain due to higher channel loss (e.g. like PAM4 modulation in PCIe6 system). These example equalizers can additionally be used in signal conditioners for USB3, USB4, DP, PCIe4, PCIe5, PCIe6 or any other wired high speed communication standards.

These equalizers are designed to selectively control amplification between a low-frequency (DC) signal amplification path and a high-frequency (AC) signal amplification path. The low-frequency (DC) path has zero or low peaking gain, and the high-frequency (AC) path provides the maximum peaking gain. These AC and DC amplification paths are selectable by adjusting their various core transistor currents that defines each path's transconductance ($g_m$). Pole/zero (i.e. degeneration impedance) for each path can also be adjusted separately, such as by varying each path's impedances, allowing greater equalizer gain curve control.

These equalizer topologies can be designed using either MOS device or bipolar transistors. No extra gain stage for the low-frequency (DC) signal amplification (e.g. OdB) is needed. Also in some example embodiments, high-frequency (AC) signal amplification peaking gain control path uses a signal-cancellation approach that improves linearity for lower programmed gain levels while maintaining low power consumption.

Figure 2:
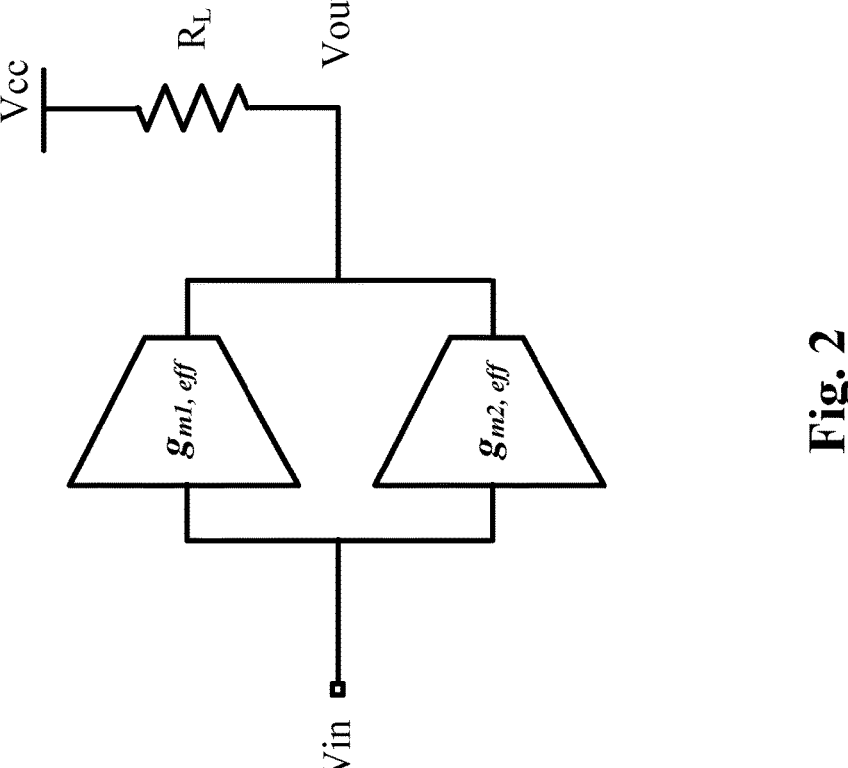
FIG. 2 represents a second example equalizer circuit.
Figure 2:
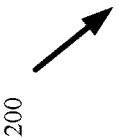

FIG. 2 represents a second example equalizer circuit 200. It is shown as single ended but it can be in differential format too. The input signal, Vin for the second example equalizer circuit 200 includes two independent and parallel signal paths (e.g. a low-frequency (DC) signal amplification path and a high-frequency (AC) signal amplification path) which have different "effective transconductance ($g_m$) transfer functions".

In this example, $g_{m1,eff}$ represents the low-frequency (DC) signal amplification path and $g_{m2,eff}$ represents the high-frequency (AC) signal amplification path.

The low-frequency (DC) ($g_{m1,eff}$) path has no or low peaking gain, which is referred as "flat band". This path sets the low frequency gain for the equalizer 200. It exhibits low pass feature with the bandwidth slightly greater than the Nyquist frequency of the data signal.

The high-frequency (AC) ($g_{m2,eff}$) path provides the peaking gain for the equalizer.

Through a weighted summation of these two signal paths, the equalizer 200 peaking gain can be programmable from OdB (i.e. flat band gain) to a predetermined (e.g. 20 dB) maximum peaking gain.

A design for the equalizer 200 that keeps $g_{m1,eff}+g_{m2,eff}$=Gm constant would satisfy the following equations:

$$g_{m1,eff} = g_{m1}/(1 + (g_{m1} + g_{m2})Z_{E1});  \qquad \text{[equation 4]}$$

$$g_{m2,eff} = g_{m2}/(1 + (g_{m1} + g_{m2})Z_{E1}); \text{ and} \qquad \text{[equation 5]}$$

$$Vout/Vin = (g_{m1,eff}) + g_{m2,eff}R_L. \qquad \text{[equation 6]}$$

For a maximum equalizer 200 peaking gain $g_{m1,eff}$ will stay at its minimum value and $g_{m2,eff}$ will stay at its maximum value. Both $g_{m1,eff}$ and $g_{m2,eff}$ are implemented in form such as shown in [equation 4] and [equation 5].

In the example embodiment shown, the load resistance, $R_L$ is shown as bulk resistors, but they can be alternatively considered as load impedances ($Z_L$) (e.g. a combination of resistors, capacitors and/or inductors).

Figure 3:
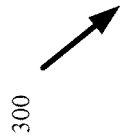
FIG. 3 represents a third example equalizer circuit.

FIG. 3 represent a third example equalizer circuit 300. The third example equalizer circuit 300 has a bias-controlled (BC) gain stage topology and includes: a first supply node 302 (e.g. power supply node configured to be coupled to a voltage supply (Vcc)), a second supply node 303 (e.g. ground reference node), a first input (IP), a second input (IN), a first output (OP), a second output (ON), a first load resistance ($R_{L1}$), a second load resistance ($R_{L2}$) (which is equal to $R_{L1}$ in a differential circuit implementation), a first transistor (e.g. bipolar (Qi1), or MOS), a second transistor (e.g. bipolar (Qi2), or MOS), a third transistor (e.g. bipolar (Qi3), or MOS), a fourth transistor (e.g. bipolar (Qi4), or MOS), a first impedance ($Z_{E1}$) (e.g. $R_g$) for the low-frequency (DC) path, a second impedance ($Z_{E2}$) (e.g. $1/(Lg+2/Cg)\|1/R_g$)) for the high-frequency (AC) path, a first bias current source 304 ($a*I_E$), a second bias current source 306 ($b*I_E$), a third bias current source 308 ($b*I_E$), a fourth bias current source 310 ($a*I_E$), and a controller 312. The controller 312 defines a set of weights (e.g. "a" and "b") for each of the bias current sources 304, 306, 308, 310.

The first transistor (Qi1) and the second transistor (Qi2) are both coupled to the first differential input (IP). The third transistor (Qi3) and the fourth transistor (Qi4) are both coupled to the second differential input (IN).

The first impedance ($Z_{E1}$) is coupled between the second transistor and the third transistor. The second impedance ($Z_{E2}$) is coupled between the first transistor and the fourth transistor. In various example embodiments, the first impedance ($Z_{E1}$) is equal to $R_g$, and the second impedance ($Z_{E2}$) is equal to $1/(Lg+2/Cg)\|1/R_g$. In many example embodiments, these first and second impedances are independently adjustable.

The first load resistance ($R_{L1}$) is coupled between the first transistor and the second transistor and the first supply node 302. The second load resistance ($R_{L2}$) is coupled between the third transistor and the fourth transistor and the first supply node 302. The first load resistance ($R_{L1}$) and the second load resistance ($R_{L2}$) are bulk resistors and not parasitic resistances. In other example embodiments of the equalizer 300, the first and second load resistances ($R_{L1}$, $R_{L2}$) are terminated to ground instead of voltage supply depending on the NPN, PNP, PMOS, or NMOS based implementations of the third equalizer circuit 300.

The first bias current source 304 is coupled to the first transistor, the second impedance ($Z_{E2}$) and the second supply node 303. The second bias current source 306 is coupled to the second transistor, the first impedance ($Z_{E1}$) and the second supply node 303. The third bias current source 308 is coupled to the third transistor, the first impedance ($Z_{E1}$) and the second supply node 303. The fourth bias current source 310 is coupled to the fourth transistor, the second impedance ($Z_{E2}$) and the second supply node 303.

The first output (OP) is coupled between the first load resistance ($R_{L1}$) and a collector of the first transistor (Qi1). The second output (ON) is coupled between the second load resistance ($R_{L2}$) and a collector of the fourth transistor (Qi4).

The controller 312 can be configured to adjust the first, second, third and fourth current sources to route different percentages of an equalizer's amplification current through either the first impedance ($Z_{E1}$) and the second impedance ($Z_{E2}$).

For example, in response to a first command (e.g. perhaps received from an I2C bus standard interface) the controller 312 is configured to adjust the first, second, third and fourth current sources 304, 306, 308, 310 to place the equalizer 300 into a primarily low-frequency (DC) signal amplification configuration that routes much of the amplification current from the first supply node 302 (e.g. power supply node) and the second supply node 303 (e.g. ground reference node), and AC current goes through the first impedance ($Z_{E1}$).

Alternatively, in response to a second command the controller 312 is configured to adjust the first, second, third and fourth current sources 304, 306, 308, 310 to place the equalizer 300 into a primarily high-frequency (AC) signal amplification configuration that routes much of the amplification current from the first supply node 302 (e.g. power supply node) and the second supply node 303 (e.g. ground reference node), and AC current goes through the second impedance ($Z_{E2}$).

Thus, the controller 312 steers varying percentages of the amplification current through the first impedance and the first impedance by weighting the first, second, third and fourth current sources 304, 306, 308, 310. For example, the controller 312 is configured to adjust, the first bias current source 304 by a first weight (a); the second bias current source 306 by a second weight (b); the third bias current source 308 by the second weight (b); and the fourth bias current source 310 by the first weight (a). For example, FIG. 3 shows bias currents $a*I_E$ and $b*I_E$, where "$I_E$" is a common part of the bias current, a and b show the applied weights by the controller circuit of 312

In some example embodiments, the controller 312 sets a+b=1, while in other example embodiments the two weighting factors can be controlled independently. When a+b=1 then a total current $g_m=Ic/V_T$ which goes to load stays constant to keep $g_{m1}+g_{m2}$ constant, and since $g_{m1}=Ic/V_T=a*I_E/V_T$ and $g_m2=I_{C2}/V_T=b*I_E/V_T$, then $g_{m1}+g_{m2}=I_E/V_T$ is constant. By keeping the total current constant, the sum of transistor device transconductances $g_{m1}+g_{m2}$ will also be relatively constant. However, because the effective gains of the amplifying stages depends on the effective degenerative impedances $Z_{E1}$ and $Z_{E2}$, having constant total current is not a necessary condition for gain control or for operation of the equalizer 300 in some example embodiments.

Thus, referring to equations 4 and 5, the first impedance ($Z_{E1}$) (e.g. Rg) is used by the controller 312 to form part of the low-frequency (DC) signal amplification path, and the second impedance ($Z_{E2}$) (e.g. $1/(Lg+2/Cg)\|1/R_g$)) is used by the controller 312 to form part of the high-frequency (AC) signal amplification path.

The third example equalizer circuit 300 also contain no shunting (i.e. dummy current) paths since the first transistor and the second transistor only receive power from the first supply node through the first load resistance ($R_{L1}$), and the third transistor and the fourth transistor only receive power from the first supply node through the second load resistance ($R_{L2}$). It should be mentioned that $R_{L1}=R_{L2}$ and in general, instead of $R_L$, a general form of an impedance like a combination of resistor and inductor and capacitor can be used as $R_{L-}$ as more complicated impedance per design requirements.

Figure 4:
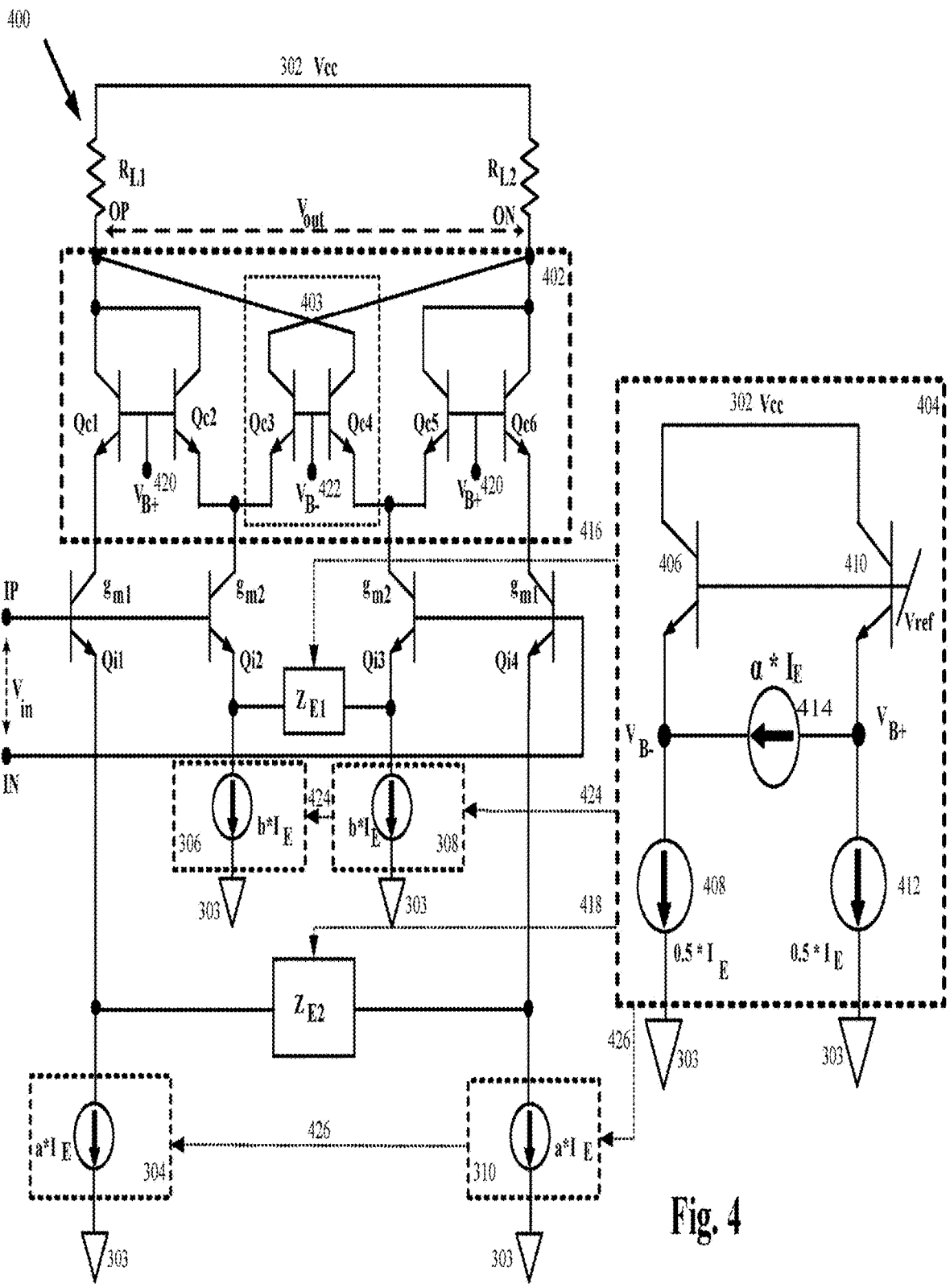
FIG. 4 represents a fourth example equalizer circuit.

FIG. 4 represents a fourth example equalizer circuit 400. The fourth example equalizer circuit 400 has a current steering controlled gain stage topology (i.e. emitter to collector couplings), as well as a bias-controlled (BC) gain stage topology (see FIG. 3). In some example embodiments, the fourth example equalizer circuit 400 has only a current steering controlled gain stage topology.

In this example embodiments, the current steering controlled gain stage topology is defined by a current steering circuit 402 coupled to a controller 404.

The current steering circuit 402 includes a set of transistors (Qc1-Qc6) that are responsive to a first control signal ($V_{B+}$) and a second control signal ($V_{B-}$) received from the controller 404. In some example embodiments, the current steering circuit 402 is an array of cascode amplifiers between differential inputs and differential load terminals.

The current steering circuit 402 also includes a current steering sub-circuit 403. The current steering sub-circuit 403 is configured to cancel signal currents for at least one of the differential amplifying pairs, resulting the gain response to be varied, and a desired equalization is achieved—without substantially varying the bias currents or frequency response of the differential amplifier.

The first transistor (Qc1) includes a collector coupled to the first load resistance ($R_{L1}$), an emitter coupled to a collector of the first transistor (Qi1), and a base coupled to the first control signal ($V_{B+}$). The second transistor (Qc2) includes a collector coupled to the first load resistance ($R_{L1}$), an emitter coupled to a collector of the second transistor (Qi2), and a base coupled to receive the first control signal ($V_{B+}$).

The third transistor (Qc3) includes a collector coupled to the second load resistance ($R_{L2}$), an emitter coupled to the collector of the second transistor (Qi2), and a base coupled to receive the second control signal ($V_{B-}$). The fourth transistor (Qc4) includes a collector coupled to the first load resistance ($R_{L1}$), an emitter coupled to a collector of the third transistor (Qi3), and a base coupled to receive the second control signal ($V_{B-}$).

The fifth transistor (Qc5) includes a collector coupled to the second load resistance ($R_{L2}$), an emitter coupled to the collector of the third transistor (Qi3), and a base coupled to receive the first control signal ($V_{B+}$). The sixth transistor (Qc6) includes a collector coupled to the second load resistance ($R_{L2}$), an emitter coupled to a collector of the fourth transistor (Qi4), and a base coupled to receive the first control signal ($V_{B+}$).

The controller 404 includes: a first transistor 406 coupled to a first current source 408 ($0.5*I_E$), a second transistor 410 coupled to a second current source 412 ($0.5*I_E$), and a reference voltage (Vref). The first control signal ($V_{B+}$) is tapped from between the first transistor 406 and the first current source 408 ($0.5*I_E$). The second control signal ($V_{B-}$) is tapped from between the second transistor 410 and the second current source 412 ($0.5*I_E$). Between the first control signal ($V_{B+}$) and the second control signal ($V_{B-}$) tap points is a third current source 414 ($\alpha*I_E$). The reference voltage (Vref) can be preset to fixed voltages or programmable, which is being generated with a current source to minimize the overall PVT variation of both DC and AC gain.

In some example embodiments, the controller 404 can be operated at lower bias currents than the core of the equalizer circuit 400. For example, both a>1 and b>1 so that the current in the controller 404 could be reduced relative to the equalizer circuit's 400 gain stage currents. The gain control value $\alpha$ would still have the range $0<\alpha<0.5$ to give the full gain control range.

Additionally, in some example embodiments $Z_{E1}$ and $Z_{E2}$ are fixed, while in other example embodiments $Z_{E1}$ and $Z_{E2}$ can be varied (e.g. the first impedance ($Z_{E1}$) (e.g. Rg) can be varied using a first control line 416, and/or the second impedance ($Z_{E2}$) can be varied using a second control line 418).

The controller 404 adjusts $V_{B+}$ over a third control line 420, and adjusts $V_{B-}$ over a fourth control line 422.

The Qc1-Qc6 transistors in the current steering circuit 402, under the control of the $V_{B+}$ and $V_{B-}$ control signals, also support setting the high-frequency (AC) signal amplification path peaking gain by keeping the collector current of the main core transistors Qi1, Qi2, Qi3 and Qi4 relatively constant. Keeping the collector currents of the core transistors relatively constant is a desirable feature, because the operating conditions and high frequency performance of the amplifying devices do not change significantly with gain.

The $g_{m1}$ stage of the equalizer 400 provides a gain that is dependent on $Z_{E1}$ and to a lesser extent on the level of bias current $a*I_E$. The gain of the $g_{m1}$ stage is not significantly controlled by or dependent upon the control voltages $V_{B-}$ and $V_{B+}$.

In contrast, the $g_{m2}$ stage of the equalizer 400 provides an effective gain that is controlled by voltages $V_{B-}$ and $V_{B+}$ and the $g_{m2}$ stage provides maximum gain contribution with the condition $V_{B+}>>V_{B-}$ and minimum gain contribution as $V_{B+}$ and $V_{B-}$ are equal. In other words, the controller 404 divides (i.e. steers percentages of) the total first supply node 302 (e.g. power supply) current between both the low-frequency (DC) signal amplification path and the high-frequency (AC) signal amplification path to shape the equalizer's 400 overall equalization curve.

In various example embodiments, the controller 404 varies the amplification gain using the current steering circuit 402 to split the signal amplification current at the output of the differential pair in such a way that the signal amplification current is partially cancelled when driving the load.

The current steering controlled gain stage topology has an advantage that the bias currents 304. 306. 308. 310 of the main/core amplifying transistors (Qi1, Qi2, Qi3, Qi4) can remain constant to better stay within their linear range.

Gain control is achieved by cancelling a portion of the output signal of the stage, but the amplifier can operate at full bias. This allows input linearity to be maintained even when stage is producing only minimal gain.

While both bias-controlled (BC) gain stage topologies and CC topologies have reduced linear range for lower gains 3-18 dB, CC topologies have a clear advantage for linear range at these lower gain levels given a similar current, and increasing current for the BC topology may not help.

In various example embodiments, the controller 404 is configured to send signals over the fifth control line 424 (adjusts "b") and the sixth control line 426 (adjusts "a") to the first, second, third and fourth current sources 304, 306, 308, 310 to further steer/route varying percentages of the equalizer's amplification current from the first supply node 302 (e.g. power supply node) and the second supply node 303 (e.g. ground reference node) through either the first impedance ($Z_{E1}$) and the second impedance ($Z_{E2}$).

In some example embodiments, the weights a+b=1; however, in other example embodiments "a" and "b" can be set independently to any value between 0 and 1 (e.g. for some applications "a" and "b" are only limited based on an acceptable range of equalizer DC operating points). If a=1, then the bias current (IE) is constant. In some example embodiments "b" is constant, b<1 to reduce flat gain current.

As mentioned above, in some example embodiments, the controller 404 can be operated at lower bias currents than the core of the equalizer circuit 400. For example, both a>1 and b>1 so that the current in the controller 404 could be reduced relative to the equalizer circuit's 400 gain stage currents. The gain control value $\alpha$ would still have the range $0<\alpha<0.5$ to give the full gain control range.

While PNP base control transistors are shown in FIG. 4, in alternate example embodiments, they can be replaced NPN transistor or various MOS device transistors.

The fourth example equalizer circuit 400 can be more favorable for higher supply voltage (3.3V applications), however it can be utilized at lower supply voltages depending on signal swing requirements and appropriate design considerations for transistor bias and current source implementation.

Figure 5:
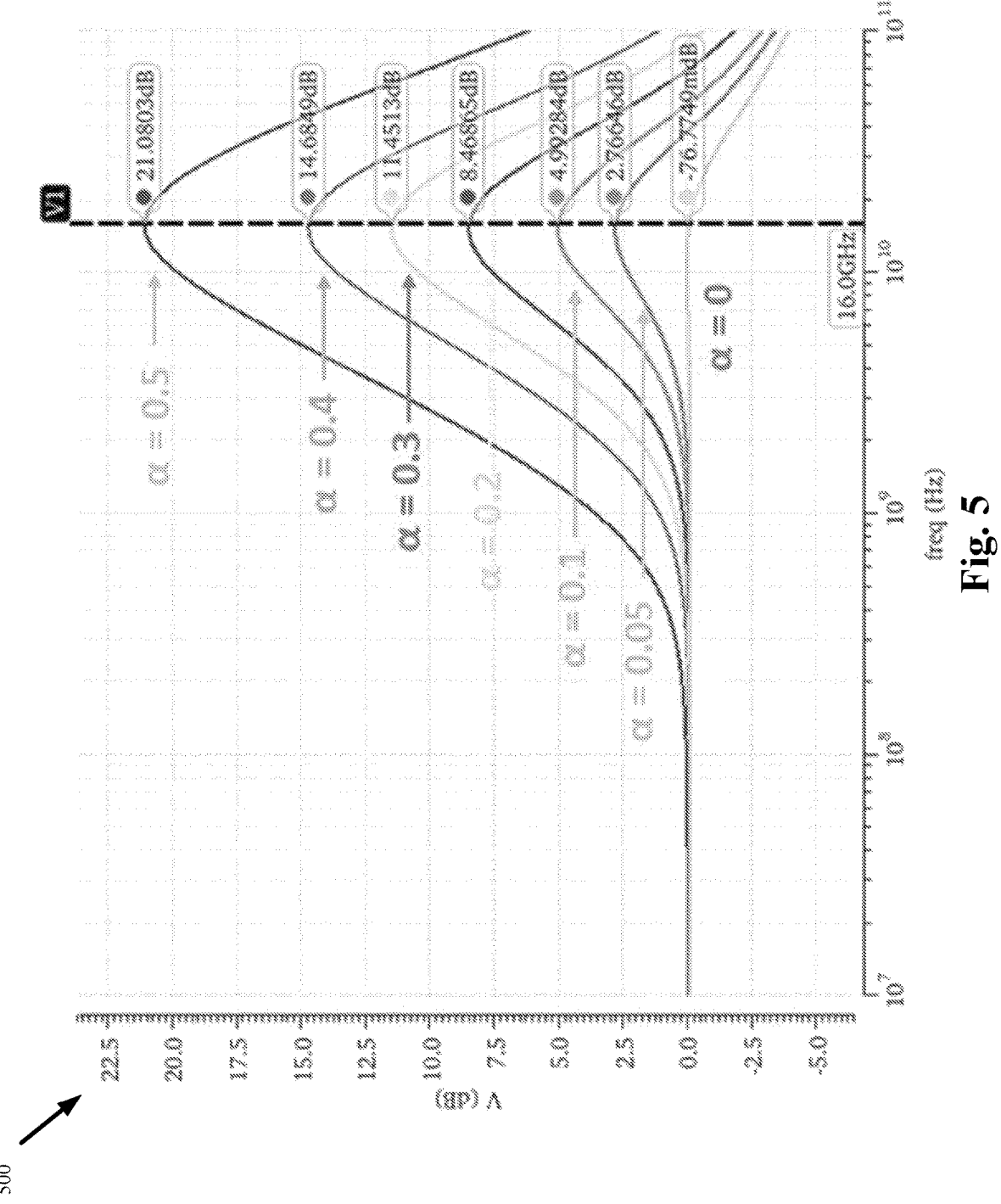
FIG. 5 represents an example graph of the equalizer circuit in operation.

FIG. 5 represents an example graph 500 of the AC response of the equalizer circuit in operation. The graph 500 shows how varying a parameter in control circuit of 404, which results in varying the $V_{B+}$ and $V_{B-}$ control signals control the high-frequency (AC) signal amplification peaking gain of the equalizer 400.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. An equalizer, comprising:
a first transistor and a second transistor both coupled to a first differential input (IP);
a third transistor and a fourth transistor both coupled to a second differential input (IN);
a first impedance ($Z_{E1}$) coupled between the second transistor and the third transistor;
a second impedance ($Z_{E2}$) coupled between the first transistor and the fourth transistor;
a first load resistance ($R_{L1}$) coupled to a first supply node;
a second load resistance ($R_{L2}$) coupled to the first supply node;
a current steering circuit coupled between the first, second, third and fourth transistors and the first and second load resistances;
a first bias current source coupled to the first transistor, the second impedance and a second supply node;
a second bias current source coupled to the second transistor, the first impedance and the second supply node;
a third bias current source coupled to the third transistor, the first impedance and the second supply node;
a fourth bias current source coupled to the fourth transistor, the second impedance and the second supply node; and
a controller;
wherein the controller is configured to adjust the current steering circuit by generating a first control signal and a second control signal and applying the first control signal and the second control signal to the current steering circuit and by controlling the first bias current source, the second bias current source, the third bias current source, and the fourth bias current source through a plurality of control lines to route a first percentage of an amplification current through the first impedance ($Z_{E1}$) and a second percentage of the amplification current through the second impedance ($Z_{E2}$).

2. The equalizer of claim 1:
wherein the controller is configured to generate a first control signal ($V_{B+}$) and a second control signal ($V_{B-}$); and
wherein the current steering circuit includes a set of transistors (Qc1-Qc6) responsive to the first and second control signals ($V_{B+}$, $V_{B-}$).

3. The equalizer of claim 2:
wherein the equalizer is configured to have a greater gain by setting the first control signal ($V_{B+}$) to a value greater than the second control signal ($V_{B-}$).

4. The equalizer of claim 2:
wherein the equalizer is configured to have a minimum gain by setting the first control signal (VB+) to a value equal to the second control signal (VB−).

5. The equalizer of claim 2:
wherein the controller is configured to keep bias currents of the first bias current source, the second bias current source, the third bias current source, and the fourth bias current source constant while the controller varies the first and second control signals ($V_{B+}$, $V_{B−}$) sent to the set of transistors (Qc1-Qc6).

6. The equalizer of claim 2:
wherein the current steering circuit includes a current steering sub-circuit (Qc3, Qc4) configured to cancel signal currents from the second transistor (Qi2) and the third transistor (Qi3).

7. The equalizer of claim 1:
wherein the current steering circuit includes a set of transistors (Qc1-Qc6) that are responsive to a first control signal ($V_{B+}$) and a second control signal ($V_{B−}$) received from the controller;
wherein the first transistor (Qc1) of the current steering circuit includes a collector coupled to the first load resistance ($R_{L1}$), an emitter coupled to a collector of the first transistor (Qi1), and a base coupled to receive the first control signal ($V_{B+}$);
wherein the second transistor (Qc2) of the current steering circuit includes a collector coupled to the first load resistance ($R_{L1}$), an emitter coupled to a collector of the second transistor (Qi2), and a base coupled to receive the first control signal ($V_{B+}$);
wherein the third transistor (Qc3) of the current steering circuit includes a collector coupled to the second load resistance ($R_{L2}$), an emitter coupled to the collector of the second transistor (Qi2), and a base coupled to receive the second control signal ($V_{B−}$);
wherein the fourth transistor (Qc4) of the current steering circuit includes a collector coupled to the first load resistance ($R_{L1}$), an emitter coupled to a collector of the third transistor (Qi3), and a base coupled to receive the second control signal (VB−);
wherein the fifth transistor (Qc5) of the current steering circuit includes a collector coupled to the second load resistance ($R_{L2}$), an emitter coupled to the collector of the third transistor (Qi3), and a base coupled to receive the first control signal ($V_{B+}$); and
wherein the sixth transistor (Qc6) of the current steering circuit includes a collector coupled to the second load resistance ($R_{L2}$), an emitter coupled to a collector of the fourth transistor (Qi4), and a base coupled to receive the first control signal ($V_{B+}$).

8. The equalizer of claim 7:
wherein the first transistor is a first bipolar transistor (Qi1), the second transistor is a second bipolar transistor (Qi2), the third transistor is a third bipolar transistor (Qi3), and the fourth transistor is a fourth bipolar transistor (Qi4);
wherein a base of the first bipolar transistor (Qi1) and a base of the second bipolar transistor (Qi2) are both coupled to the first differential input (IP);
wherein a base of the third bipolar transistor (Qi3) and a base of the fourth bipolar transistor (Qi4) are both coupled to the second differential input (IN);
wherein the first impedance is coupled between an emitter of the second bipolar transistor and an emitter of the third bipolar transistor;

wherein the second impedance is coupled between an emitter of the first bipolar transistor and an emitter of the fourth bipolar transistor;
wherein a collector of the first bipolar transistor (Qi1) is coupled to the first transistor (Qc1) of the current steering circuit;
wherein a collector of the second bipolar transistor (Qi2) is coupled to the second transistor (Qc2) of the current steering circuit and the third transistor (Qc3) of the current steering circuit;
wherein a collector of the third bipolar transistor (Qi3) is coupled to the fourth transistor (Qc4) of the current steering circuit and the fifth transistor (Qc5) of the current steering circuit; and
wherein a collector of the fourth bipolar transistor (Qi4) is coupled to the sixth transistor (Qc6) of the current steering circuit.

9. The equalizer of claim 7:
wherein the first transistor is a first MOS device, the second transistor is a second MOS device, the third transistor is a third MOS device, and the fourth transistor is a fourth MOS device;
wherein a gate of the first MOS device and a gate of the second MOS device are both coupled to the first differential input (IP);
wherein a gate of the third MOS device and a gate of the fourth MOS device are both coupled to the second differential input (IN);
wherein the first impedance is coupled between a source of the second MOS device and a source of the third MOS device;
wherein the second impedance is coupled between a source of the first MOS device and a source of the fourth MOS device;
wherein a drain of the first MOS device is coupled to the first transistor (Qc1) of the current steering circuit;
wherein a drain of the second MOS device is coupled to the second transistor (Qc2) of the current steering circuit and the third transistor (Qc3) of the current steering circuit;
wherein a drain of the third MOS device is coupled to the fourth transistor (Qc4) of the current steering circuit and the fifth transistor (Qc5) of the current steering circuit; and
wherein a drain of the fourth MOS device is coupled to the sixth transistor (Qc6) of the current steering circuit.

10. The equalizer of claim 1:
wherein the controller is further configured to adjust the first, second, third and fourth bias current sources through the control lines to route the first percentage of an amplification current through the first impedance ($Z_{E1}$) and the second percentage of the amplification current through the second impedance ($Z_{E2}$).

11. The equalizer of claim 1:
wherein a first differential output (OP) is coupled between the first load resistance ($R_{L1}$) and the current steering circuit; and
wherein a second differential output (ON) is coupled between the second load resistance ($R_{L2}$) and the current steering circuit.

12. The equalizer of claim 1:
wherein the first supply node is a power supply node; and
wherein the second supply node is a ground reference node.

13. The equalizer of claim 1:

wherein the first load resistance ($R_{L1}$) and the second load resistance ($R_{L2}$) are bulk resistors and not parasitic resistances.

14. The equalizer of claim 1:

wherein the first, second, third and fourth transistors only receive power from the first supply node through either or both the first load resistance ($R_{L1}$) and the second load resistance ($R_{L2}$).

15. The equalizer of claim 1:

wherein the controller is configured to further steer the amplification current between the first impedance and the second impedance by adjusting weight assigned to the first, second, third and fourth current sources.

16. The equalizer of claim 1:

wherein the first impedance ($Z_{E1}$) is a low-frequency (DC) path for the amplification current; and wherein the second impedance ($Z_{E2}$) is a high-frequency (AC) path for the amplification current.

17. The equalizer of claim 1:

wherein the first and second impedances are independently adjustable.

18. The equalizer of claim 1:

wherein the equalizer is a continuous time linear equalizer (CTLE).

19. The equalizer of claim 1:

wherein the controller is configured to adjust a bias current for both the second and third bias current sources coupled to either end of the first impedance ($Z_{E1}$) by varying a first control signal sent to each of the second and third bias current sources; and wherein the controller is configured to adjust a bias current for both the first and fourth bias current sources coupled to either end of the second impedance ($Z_{E2}$) by varying a second control signal sent to each of the first and fourth bias current sources.

20. The equalizer of claim 1:

wherein the set of transistors (Qc1-Qc6) in the current steering circuit are configured as an array of cascode amplifiers between the first and second differential inputs (IP, IN) and the first and second differential outputs (OP, ON).

21. The equalizer of claim 1:

wherein the controller includes, a first transistor having a first terminal coupled to the first supply node, a second terminal coupled to the second supply node through a first current source ($0.5*I_E$), and a third terminal coupled to a reference voltage (Vref);

a second transistor having a first terminal coupled to the first supply node, a second terminal coupled to the second supply node through a second current source ($0.5*I_E$), and a third terminal coupled to the reference voltage (Vref);

wherein the first control signal ($V_{B+}$) is tapped from between the first transistor of the controller and the first current source ($0.5*I_E$); and wherein the second control signal ($V_{B-}$) is tapped from between the second transistor of the controller and the second current source ($0.5*I_E$).

* * * * *